(12) United States Patent
Baldi et al.

(10) Patent No.: US 6,188,121 B1
(45) Date of Patent: Feb. 13, 2001

(54) HIGH VOLTAGE CAPACITOR

(75) Inventors: Livio Baldi, Agrate Brianza; Paolo Ghezzi, Rivolta D'Adda; Alfonso Maurelli, Sulbiate, all of (IT)

(73) Assignee: SGS-Thomson Microelectronics S.r.l., Agrate Brianza (IT)

( * ) Notice: Under 35 U.S.C. 154(b), the term of this patent shall be extended for 0 days.

(21) Appl. No.: 09/119,115

(22) Filed: Jul. 20, 1998

(30) Foreign Application Priority Data

Jul. 23, 1997 (EP) .................................................. 97830384

(51) Int. Cl.[7] .................................................. H01L 29/00
(52) U.S. Cl. .................................................. 257/532; 257/535
(58) Field of Search .................................. 257/316, 532, 257/535, 319, 320

(56) References Cited

U.S. PATENT DOCUMENTS

| 4,314,265 | * | 2/1982 | Simko | 257/320 |
| 4,527,180 | * | 7/1985 | Oto | 257/532 |
| 4,768,080 | * | 8/1988 | Sato | 257/316 |
| 5,111,430 | * | 5/1992 | Morie | 257/320 |
| 5,166,858 | | 11/1992 | Frake et al. | 361/313 |
| 5,852,311 | * | 12/1998 | Kwon et al. | 257/316 |

FOREIGN PATENT DOCUMENTS

| 2341177 | | 9/1977 | (FR) . | |
| 2045526 | | 10/1980 | (GB) . | |
| 2300969 | | 11/1996 | (GB) . | |
| 54-40043 | * | 3/1979 | (JP) | 247/319 |
| 58-209165 | * | 12/1983 | (JP) | 257/319 |
| 61-073367 | * | 4/1986 | (JP) | 257/532 |
| 2-213159 | * | 8/1990 | (JP) | 257/532 |
| 4-164364 | * | 6/1992 | (JP) | 257/532 |

OTHER PUBLICATIONS

Nondestructive Readout 3 Dimensional Dual Insulator Memory, *IBM Technical Disclosure Bulletin*, vol. 17, No. 1, pp. 28–29, Jun. 1974.

* cited by examiner

*Primary Examiner*—J. Carroll
(74) *Attorney, Agent, or Firm*—Jenkens & Gilchrist, P.C.; Theodore E. Galanthay

(57) ABSTRACT

A high voltage capacitor, integratable monolithically on a semiconductor substrate which accommodates a field oxide region overlaid by a first layer of polycrystalline silicon isolated from a second layer of polycrystalline silicon by an interpoly dielectric layer, comprises two elementary capacitors having a first common conductive plate which is formed in the first layer of polycrystalline silicon. Each of these elementary capacitors has a second conductive plate formed in the second layer of polycrystalline silicon above the first plate, and includes said interpoly dielectric layer as an isolation dielectric between the two plates.

3 Claims, 3 Drawing Sheets

HIGH VOLTAGE CAPACITOR

FIELD OF THE INVENTION

This invention relates to a high voltage capacitor. In particular, the invention relates to a high voltage capacitor adapted to be integrated monolithically on a semiconductor substrate accommodating a field oxide region overlaid by a first layer of polycrystalline silicon isolated from a second layer of polycrystalline silicon by an interpoly dielectric layer.

BACKGROUND OF THE INVENTION

Background Art

As is well known, many applications related to semiconductor integrated electronic circuits require the use or generation of higher voltages than a supply voltage Vcc. In particular, electrically programmable non-volatile memories, such as EPROMs, EEPROMs, or FLASH EEPROMs, need a write voltage far above the standard 3 to 5 Volts supply.

The most up-to-date integrated circuit applications concern systems which utilize supply voltages in the 3-Volt range. Such systems often employ semiconductor memories of the non-volatile type. In order to maintain the characteristics of such active integrated devices as transistors or memory cells unchanged at low supply voltages, it has been necessary to introduce thin (160Å or less) oxides.

However, it is a well recognized fact that EPROMs, EEPROMs and FLASH EEPROMs all require high (12V) programming voltages that such thin oxides cannot withstand. Thus, the introduction of a second and thicker (e.g. 20 to 30 nm) oxide has become necessary for high voltage transistors. These programming voltages must, in the instance of EEPROMs and FLASH EEPROMs, be generated internally from the external supply voltage by means of suitable circuits, known as voltage multipliers or charge pumps and based on the use of capacitors, which must be capable of withstanding the high voltages involved in the final stages of the circuit.

These capacitors can be formed between the polycrystalline silicon and a diffusion provided in the substrate, using the high voltage oxide as a dielectric. However, they have certain disadvantages, as follows:

the diffusion which forms one of the capacitor electrodes is part of the standard processing flow for EEPROMs, but involves an additional masking step for FLASH EEPROM memories; and one of the capacitor electrodes is connected to the substrate via a diode, which introduces limitations on the supply polarities.

On the other hand, non-volatile memories of the EPROM, FLASH EEPROM and EEPROM types include two levels of polycrystalline silicon, separated by a dielectric, which lend themselves ideally for forming a capacitor with both electrodes floating.

A limiting factor to the use, in integrated circuits of this kind, of capacitors formed between two levels of polysilicon is represented by the maximum voltage that the interpoly oxide can withstand. This oxide is usually quite thin (within the range of 15 to 20 nm), since it has to be used in memory cells. In fact, the efficiency of the memory cell is critically dependent on the coupling coefficient between the control gate and the floating gate, which is the better the thinner the interpoly dielectric, whose lower limit is only set by problems of faulty construction. However, forming thick and thin interpoly dielectrics simultaneously in the same device is a fairly complicated operation involving at least one masking step.

The underlying technical problem of this invention is to enable the formation of a high voltage capacitor in a double polysilicon level, monolithically integratable on a semiconductor substrate without the addition of technological steps to the manufacturing process of the device to which the capacitor is integrated, thereby overcoming the aforementioned limitations of the prior art.

The technical problem is solved by a capacitor as further described below.

SUMMARY OF THE INVENTION

It is a primary objective of the present invention to provide a high voltage capacitor which is integratable monolithically on a semiconductor substrate which accommodates a field oxide region overlaid by a first layer of polycrystalline silicon isolated from a second layer of polycrystalline silicon by an interpoly dielectric layer, and comprises two elementary capacitors having a first common conductive plate which is formed in the first layer of polycrystalline silicon. Each of these elementary capacitors has a second conductive plate formed in the second layer of polycrystalline silicon above the first plate, and includes said interpoly dielectric layer as an isolation dielectric between the two plates.

Additional objects, advantages, and novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

DETAILED DESCRIPTION OF A PREFERRED EMBODIMENT OF THE INVENTION

Figure 1:
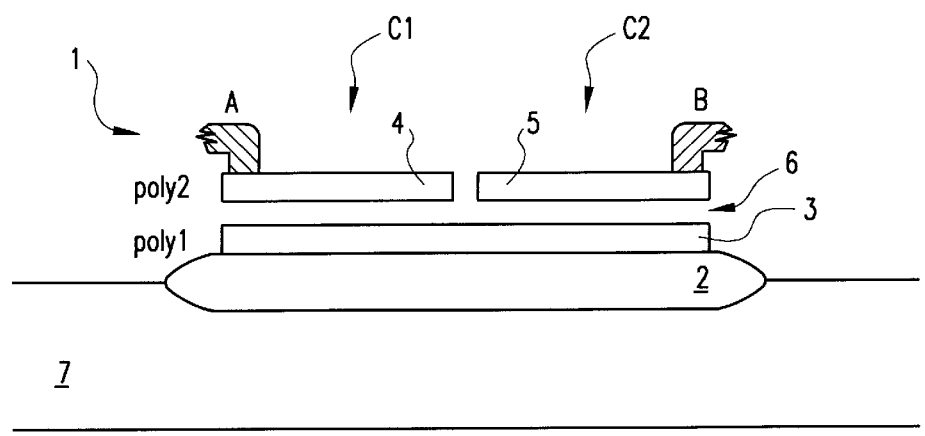
FIG. 1 shows a cross-section through a capacitor, integrated to a double polysilicon level structure, according to this invention.

Referring to the drawings, generally shown at 1 is a high voltage capacitor, embodying this invention, which is formed into an essentially sandwich type of integrated structure. Throughout the description, the same reference numerals are used with regard to each drawing. As shown in FIG. 1, the structure 1 comprises a semiconductor substrate 7 having a certain type of dopant, e.g., of the P type, and on which an isolation layer 2 of field oxide has been grown. It would also be possible to use a semiconductor substrate 7 of the N type. The isolation layer 2 alternatively could be a gate oxide, preferably the same as that used for the high voltage transistors.

A first layer of polycrystalline silicon POLY1 is deposited over the isolation layer 2 which has a portion 3 provided therein to form an intermediate plate of the capacitor 1. Over the first layer of polycrystalline silicon POLY1, there is deposited a layer of interpoly dielectric 6 overlaid by a second layer of polycrystalline silicon POLY2. The interpoly dielectric may be a thermally grown oxide, or preferably a stack of thermal oxide, silicon nitride deposited by chemical vapor deposition ("CVD") and an either thermal or deposited oxide known as an Oxide-Nitride-Oxide ("O.N.O.") stack. Other combinations of thermal oxide, or CVD and nitride, are also viable.

The second layer POLY2 comprises first 4 and second 5 portions which are structurally independent of and separated from each other. The first portion 4 includes a first contact terminal A, and the second portion 5 includes a second contact terminal B. These contact terminals are formed conventionally by appropriate metallizations carried out directly onto said second polysilicon layer. The contact area may be located within or without the capacitor. The contact metallizations can be provided by contact techniques using metals or alloys such as Al, Al—Si, Al—Si—Cu, but also by barrier or plug techniques, as are known to the skilled persons in the art.

Thus, the integrated structure 1 has the features of a dual capacitor comprising a first C1 and a second C2 elementary capacitor. In fact, it is readily possible to recognize a first elementary capacitor C1 defined by the first portion 4 of the layer POLY2 and the portion 3 of the layer POLY1, which form the conductive plates, and by the interpoly oxide layer 6 forming the dielectric between these plates.

Likewise, a second elementary capacitor C2 can be recognized which is defined by the second portion 5 of the layer POLY2 and the portion 3 of the layer POLY1, which form the plates, with the interpoly oxide layer 6 providing the dielectric layer. The portion 3 of the layer POLY2 is, therefore, a single plate shared by both elementary capacitors, C1 and C2.

Figure 2:
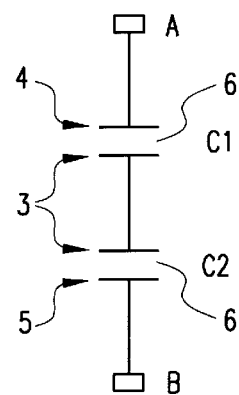
FIG. 2 is an equivalent electric diagram of the capacitor shown in FIG. 1.

FIG. 2 shows the equivalent circuit of the high voltage capacitor 1 shown in FIG. 1. It can be seen that the elementary capacitors C1 and C2 are connected in series between the contact terminals A and B. FIG. 2 shows a first plate 4 contacted by the terminal A, the common plate 3, and a second plate 5 contacted by the terminal B.

The highest voltage that the resultant capacitor 1 can withstand is, therefore, given by the sum of the maximum voltages that the dielectric layers of the elementary capacitors C1 and C2 can withstand. Since both capacitors use, for a dielectric, the same layer of interpoly oxide 6, the highest voltage that the oxide can withstand is practically double, since the electric field applied is split to the series of the two capacitors.

Of course, the capacitance of the resultant capacitor 1 is given as:

$$C = \frac{C_1 * C_2}{C_1 + C_2}$$

In the instance of both elementary capacitors having the same area, C will be one half the capacitance of an individual elementary capacitor. To obtain an equivalent capacitance which be equal to the capacitance of the individual elementary capacitors, it is therefore necessary to double the total area occupied by the capacitor. Different designs of the capacitor structure, either with rectangular plates or concentric plates, are possible.

In addition, while the contacts on the two plates can be formed above the capacitor dielectric as shown in FIG. 1, it would also be possible to continue the two electrodes A and B onto the field oxide, outside the electrode of Poly1, and provide the contacts in this region. The capacitor 1 may also be formed, as shown in the example of FIG. 3, by reversing the two levels of polysilicon.

Figure 3:
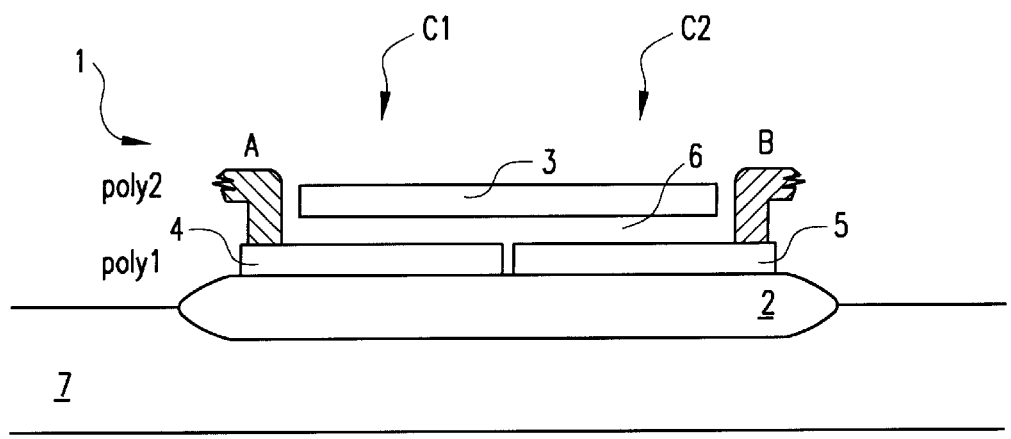
FIG. 3 shows a cross-section through a second embodiment of an integrated capacitor, according to this invention.

The structure 1 of FIG. 3 comprises a semiconductor substrate 7 having a certain type of dopant, e.g., of the P type, on which an isolation layer of field oxide 2 has been grown. Deposited over the isolation layer 2 is a first layer of polycrystalline silicon POLY1 having first 4 and second 5 portions formed therein which are structurally independent of and isolated from each other. The first portion 4 includes a first contact terminal A, and the second portion 5 includes a second contact terminal B.

A dielectric layer of interpoly 6 is deposited onto the first layer of polycrystalline silicon POLY1 and overlaid by a second layer of polycrystalline silicon POLY2.

The interpoly dielectric may be a thermally grown oxide or, preferably, a stack of thermal oxide, silicon nitride deposited by CVD and an either thermal or deposited oxide known as O.N.O.. Other combinations of thermal oxide, or CVD and nitride, are also viable. The second layer POLY2 includes a portion 3 which forms an intermediate plate of the capacitor 1.

Thus, the integrated structure 1 is in the form of a double capacitor comprising first C1 and second C2 elementary capacitors. In fact, there can be recognized a first elementary capacitor C1 formed by the first portion 4 of the layer POLY1 and the portion 3 of the layer POLY2, providing the conductive plates, and by the interpoly oxide layer 6 providing the dielectric between these plates.

A second elementary capacitor C2 is also identifiable which is formed by the second portion 5 of the layer POLY1 and the portion 3 of the layer POLY2, both providing its plates, with the dielectric layer being provided by the interpoly oxide layer 6. The portion 3 of the layer POLY2 is, therefore, a plate shared by both elementary capacitors C1 and C2. The portions 4 and 5 may be contacted in the Poly1 directly or through contact areas in Poly2.

The configuration of FIG. 3 has the advantage that the terminating electrodes, formed from the portions 4, 5 and respective contacts A, B, are shielded from noise caused by any overlying metals.

Figure 4:
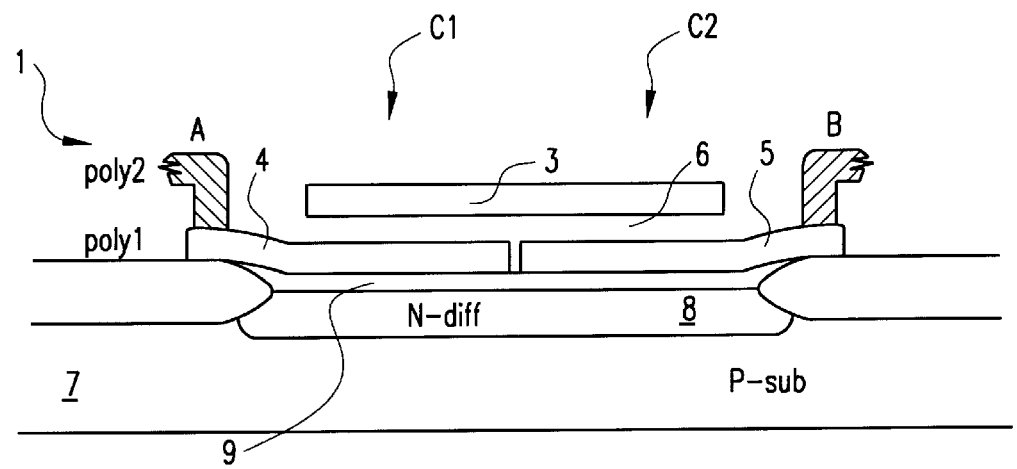
FIG. 4 shows a cross-section through a third embodiment of an integrated capacitor, according to this invention.

A further embodiment of the invention, whereby the capacitive coupling of the two terminals A and B can be improved, consists of forming the capacitor 1, with the common plate in Poly2, above a gate oxide area 9, preferably at a high voltage, overlying a diffusion 8 of the opposite type from the substrate, as shown in FIG. 4. A condition is that the gate oxide 9 should have a comparable thickness to that of the interpoly dielectric 6, or at least adequate to withstand one half of the total voltage applied to the capacitor. In this configuration, the diffusion 8 in the substrate functions as a further capacitor plate, thereby doubling the capacitance per unit area.

Figure 5:
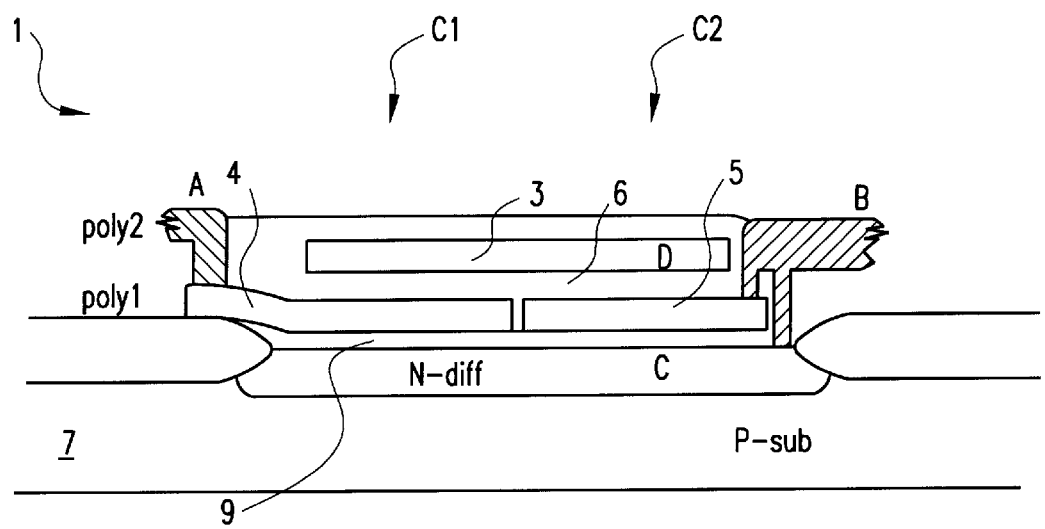
FIG. 5 shows a cross-section through a fourth embodiment of an integrated capacitor, according to this invention.

A further embodiment of the invention is shown in FIG. 5. This embodiment can be of advantage where the specific capacitance of the capacitors formed between the polysilicon and the diffusion is to be increased using an interpoly dielectric which cannot withstand the full voltage.

Figure 6:
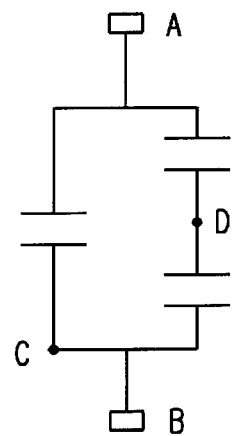
FIG. 6 is an equivalent electric diagram of the capacitor shown in FIG. 5.

In this embodiment, the capacitor is formed with the floating gate in POLY2, over a high voltage gate oxide 9, itself overlying a diffusion that is here connected electrically to one 5 of the two plates 4, 5 formed in POLY1. The overall capacitance will, therefore, result from the parallel of one capacitance POLY1-diffusion and the series of two capacitances between POLY1 and POLY2, as illustrated by the equivalent electric diagram of FIG. 6.

Thus, the ability to produce a high voltage capacitor integrated to a device, using a standard process providing two polysilicon levels and by a mere layout expedience instead of additional technological or masking steps, is highly advantageous.

In fact, this high voltage capacitor can be formed by any of the processes which provide for a double level of polysilicon, such as the CMOS processes for fabricating non-volatile memories. In such devices, high voltages must be handled for programming and erasing the memory cells.

However, such a capacitor can be integrated to all those devices which require the servicing of relatively high voltages with respect to the voltage supply to the devices.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention as claimed.

We claim:

1. A high voltage capacitor integrated monolithically on a semiconductor structure comprising, from the bottom up:

a diffusion region disposed in the semiconductor substrate;

a gate oxide layer disposed over the diffusion region;

a first layer of polycrystalline silicon disposed over the gate oxide layer;

an interpoly dielectric layer; and a second layer of polycrystalline silicon disposed over the interpoly dielectric layer such that two series-connected, elementary capacitors are formed having a first common conductive plate which is formed in the second layer of polycrystalline silicon, and each elementary capacitor having a second conductive plate formed in the first layer of polycrystalline silicon below the first common conductive plate and including said interpoly dielectric layer as an isolation dielectric between the first common conductive plate and the second conductive plates, the diffusion region being coupled capacitively to a first one of the second conductive plates and electrically connected to a second one thereof, the second conductive plates being structurally independent of and isolated from each other, the high voltage capacitor having a first terminal on a first of the second conductive plates and a second terminal on a second of the second conductive plates, and the first common conductive plate is floating.

2. The high voltage capacitor according to claim 1, wherein the interpoly dielectric layer is an Oxide-Nitride-Oxide stack used as a dielectric in non-volatile memory cells.

3. The high voltage capacitor of claim 1, wherein the diffusion region, the gate oxide layer and the second conductive plates form a third capacitor connected between the first terminal of the high voltage capacitor an the second terminal thereof.

* * * * *